(12) United States Patent
Cui

(10) Patent No.: US 12,369,476 B2
(45) Date of Patent: Jul. 22, 2025

(54) TRANSPARENT DISPLAY PANEL AND METHOD FOR PREPARING SAME, AND DISPLAY APPARATUS

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 649 days.

(21) Appl. No.: 17/638,832

(22) PCT Filed: Apr. 20, 2021

(86) PCT No.: PCT/CN2021/088517
§ 371 (c)(1),
(2) Date: Feb. 27, 2022

(87) PCT Pub. No.: WO2021/227794
PCT Pub. Date: Nov. 18, 2021

(65) Prior Publication Data
US 2022/0310725 A1 Sep. 29, 2022

(30) Foreign Application Priority Data

May 11, 2020 (CN) .......................... 202010394367.1

(51) Int. Cl.
*H10K 59/35* (2023.01)
*H10K 59/12* (2023.01)
(Continued)

(52) U.S. Cl.
CPC ......... *H10K 59/352* (2023.02); *H10K 59/122* (2023.02); *H10K 59/353* (2023.02);
(Continued)

(58) Field of Classification Search
CPC .. H10K 59/122; H10K 59/353; H10K 59/352; H10K 71/00; H10K 71/135; H10K 77/10; Y02E 10/549; Y02P 70/50
See application file for complete search history.

(56) References Cited

U.S. PATENT DOCUMENTS 9,547,252 B2    1/2017  Mizuno et al.
2011/0241014 A1* 10/2011 Yoon .................... H10K 59/131
                                                                    257/72

(Continued)

FOREIGN PATENT DOCUMENTS

CN    104201292 A    12/2014
CN    107895736 A    4/2018
(Continued)

OTHER PUBLICATIONS

International Search Report and Written Opinion mailed on Jul. 22, 2021, corresponding PCT/CN2021/088517, 8 pages.
(Continued)

*Primary Examiner* — Ajay Ojha
*Assistant Examiner* — Sandra Milena Rodriguez Villan
(74) *Attorney, Agent, or Firm* — XSENSUS LLP

(57) ABSTRACT

The present disclosure provides a transparent display panel and method for manufacturing the same and a display device. The transparent display panel includes pixel units arranged in an array, and the pixel unit includes a light-emitting area and a transparent area. The pixel unit includes a pixel defining layer disposed in the light-emitting area and defining a plurality of opening areas. A light-emitting device is disposed in the opening area. The pixel unit further includes a transparent film layer disposed in the transparent area and being of a hydrophobic material. The transparent film layer includes a groove and an inclined channel, and the channel connects the groove with any one of the opening areas. A bottom surface of the groove is higher than a bottom (Continued)

surface of the opening area, and an area of the groove is greater than that of the opening area connected with the channel.

19 Claims, 5 Drawing Sheets

(51) Int. Cl.
    *H10K 59/122*     (2023.01)
    *H10K 71/00*     (2023.01)
    *H10K 71/13*     (2023.01)

(52) U.S. Cl.
    CPC ....... *H10K 71/135* (2023.02); *H10K 59/1201* (2023.02); *H10K 71/00* (2023.02)

(56) References Cited

U.S. PATENT DOCUMENTS

| | | |
|---|---|---|
| 2015/0362855 A1 | 12/2015 | Mizuno et al. |
| 2019/0229163 A1 | 7/2019 | Murai et al. |
| 2020/0243621 A1 | 7/2020 | Zhao |

FOREIGN PATENT DOCUMENTS

| | | |
|---|---|---|
| CN | 108428723 A | 8/2018 |
| CN | 108807457 A | 11/2018 |
| CN | 109860438 A | 6/2019 |
| CN | 110544713 A | 12/2019 |
| CN | 110854174 A | 2/2020 |
| CN | 111554711 A | 8/2020 |
| CN | 109860438 B | 12/2020 |
| WO | 2018/196271 A1 | 11/2018 |
| WO | 2020/164528 A1 | 8/2020 |

OTHER PUBLICATIONS

Office Action issued on Feb. 15, 2022, in corresponding Chinese patent Application No. 202010394367.1, 22 pages.
Office Action issued on Jul. 13, 2022, in corresponding Chinese patent Application No. 202010394367.1, 19 pages.

* cited by examiner

TRANSPARENT DISPLAY PANEL AND METHOD FOR PREPARING SAME, AND DISPLAY APPARATUS

CROSS-REFERENCE TO RELATED APPLICATIONS

The present disclosure is a national phase application under 35 U.S.C. § 371 based upon International Application No. PCT/CN2021/088517 filed on Apr. 20, 2021, which claims the benefit of and priority to Chinese Patent Application No. 202010394367.1, entitle "TRANSPARENT DISPLAY PANEL AND METHOD FOR PREPARING SAME, AND DISPLAY APPARATUS" filed on May 11, 2020, where the contents of both of which are incorporated by reference in their entireties herein.

TECHNICAL FIELD

The present disclosure relates to the field of display technology and, particularly, to a transparent display panel and method for manufacturing the same and further a display device.

BACKGROUND

Inkjet printing polymer electroluminescence display (PLED) technology has advantages such as simple operation, low cost, simple process and easy realization of large size. With the continuous research of high-performance polymer materials and the further improvement of thin film preparation technology, the PLED technology is expected to be rapidly industrialized.

For high-resolution transparent displays, pixels will become smaller and smaller. When using inkjet printing to manufacture high-resolution transparent display devices, luminescent materials shall be printed in a small light-emitting area, which imposes strict requirements on inkjet printing equipment. Generally, the sub-pixel area of some colors is smaller than that of other colors. In the case of high resolution, the luminescent material shall be printed in a smaller opening area, and the increasingly high preparation requirements limit the application of the inkjet printing technology.

It should be noted that the information disclosed in the above Background section is only for enhancement of understanding of the background of the present disclosure, and therefore may contain information that does not form the prior art that is already known to a person skilled in the art.

SUMMARY

The present disclosure is to provide a transparent display panel and method for manufacturing the same and a display device.

An aspect of the present disclosure provides a transparent display panel, including a plurality of pixel units arranged in an array, the pixel unit including a light-emitting area and a transparent area, wherein the pixel unit includes:
 a substrate;
 a pixel defining layer disposed in the light-emitting area of the substrate, and defining a plurality of opening areas;
 a plurality of light-emitting devices, disposed in the plurality of opening areas in a one-to-one correspondence; and
 a transparent film layer, disposed in the transparent area of the substrate and being of a hydrophobic material, the transparent film layer including a groove and a channel, and the channel connecting the groove with any one of the opening areas,
 wherein the channel has an inclined angle relative to the substrate, a distance from a bottom surface of the groove to the substrate is greater than a distance from a bottom surface of the opening area to the substrate, and a projection area of the groove on the substrate is greater than a projection area of the opening area connected with the channel on the substrate.

In an exemplary embodiment of the present disclosure, projection areas of respective opening areas in the pixel unit on the substrate are not exactly the same, and the channel connects the groove with the opening area having a smallest projection area.

In an exemplary embodiment of the present disclosure, the pixel unit includes a red light-emitting device, the red light-emitting device is disposed in the opening area having the smallest projection area, and the channel connects the groove with the opening area provided with the red light-emitting device.

In an exemplary embodiment of the present disclosure, in the pixel unit, the respective opening areas are arranged along a first direction, the pixel area and the light-emitting area are arranged along a second direction perpendicular to the first direction, and the groove is strip-shaped and extends along the first direction.

In an exemplary embodiment of the present disclosure, the pixel unit includes two green light-emitting devices, the two green light-emitting devices are disposed in two opening areas having the smallest projection area, the pixel unit include two channels, and the two channels connects the groove with the two opening areas provided with the two green light-emitting devices in a one-to-one correspondence.

In an exemplary embodiment of the present disclosure, in the pixel unit, the opening areas provided with the two green light-emitting devices are arranged along a first direction, the pixel area and the light-emitting area are arranged along a second direction perpendicular to the first direction, and the groove is strip-shaped and extends along the first direction.

In an exemplary embodiment of the present disclosure, the grooves of respective pixel units arranged in a same straight line are connected with each other.

In an exemplary embodiment of the present disclosure, an extending direction of the groove is perpendicular to an extending direction of the channel.

In an exemplary embodiment of the present disclosure, the inclined angle of the channel is 5° to 50°.

In an exemplary embodiment of the present disclosure, the transparent film layer and the pixel defining layer are formed of a same material and provided in a same layer.

In an exemplary embodiment of the present disclosure, the hydrophobic material includes fluorine-modified polyimide or fluorine-modified polymethyl methacrylate.

Another aspect of the present disclosure provides a display device including the transparent display panel described above.

Yet another aspect of the present disclosure provides a method for manufacturing a transparent display panel, including:
 providing a substrate with a light-emitting area and a transparent area of each pixel unit being divided;

forming a pixel defining layer in the light-emitting area of the substrate, and defining a plurality of opening areas by the pixel defining layer;

forming a transparent film layer in the transparent area, the transparent film layer being of a hydrophobic material, the transparent film layer including a groove and a channel, and the channel connecting the groove with any one of the opening areas of a corresponding pixel unit, wherein the channel has an inclined angle relative to the substrate, a distance from a bottom surface of the groove to the substrate is greater than a distance from a bottom surface of the opening area to the substrate, and a projection area of the groove on the substrate is greater than a projection area of the opening area connected with the channel on the substrate;

printing ink containing a to-be-printed film layer material into the groove by means of inkjet printing, so that the ink flows from the channel into the opening area to form a target film layer.

In an exemplary embodiment of the present disclosure, the target film layer is an organic light-emitting layer.

It should be understood that the above general description and the following detailed description are only exemplary and explanatory, and cannot limit the present disclosure.

BRIEF DESCRIPTION OF THE DRAWINGS

The accompanying drawings, which are incorporated in and constitute a part of this specification, illustrate embodiments in accordance with the present disclosure, and together with the description, serve to explain the principle of the present disclosure. Understandably, the drawings in the following description are only some embodiments of the present disclosure, and for a person skilled in the art, other drawings may also be obtained from these drawings without creative efforts.

DETAILED DESCRIPTION

Figure 1:
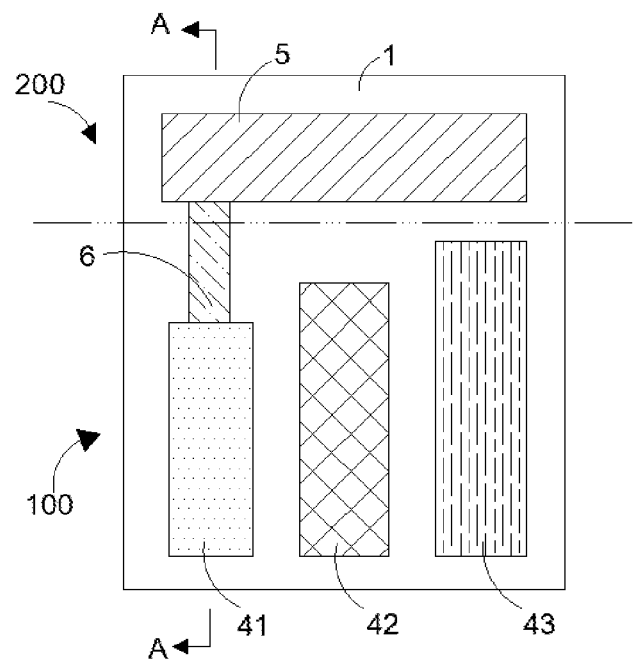
FIG. 1 is a schematic structural diagram of a pixel unit according to an embodiment.

Example embodiments will now be described more fully with reference to the accompanying drawings. Example embodiments, however, may be embodied in various forms and should not be construed as being limited to the embodiments set forth herein; rather, these embodiments are provided so that the present disclosure will be thorough and complete, and will fully convey the concept of example embodiments to a person skilled in the art. The same reference numerals in the drawings denote the same or similar structures, and thus detailed descriptions thereof will be omitted.

In the related art, the inkjet printing technology is to spray solutions (inks) of red, green, and blue luminescent materials into opening areas 110 of a pre-patterned ITO substrate through a micron-scale printing nozzle, so as to form light-emitting pixel units of three primary colors of red, green, and blue. The thickness of a film layer is determined by the amount of solute printed within a pixel. Such method may greatly save expensive luminescent materials, and by printing through a plurality of nozzles (128 or 256 nozzles), a film formation time may be greatly shortened. Therefore, the application of inkjet printing color pattern technology in PLED manufacturing is recognized as a main technical direction toward industrialization.

For a transparent display panel with higher and higher resolutions, the area of an opening area is getting smaller and smaller, and thus, in order to accurately print a to-be-printed material, especially an organic light-emitting material, in the opening area, the precision of inkjet printing technology shall be very high.

Figure 2:
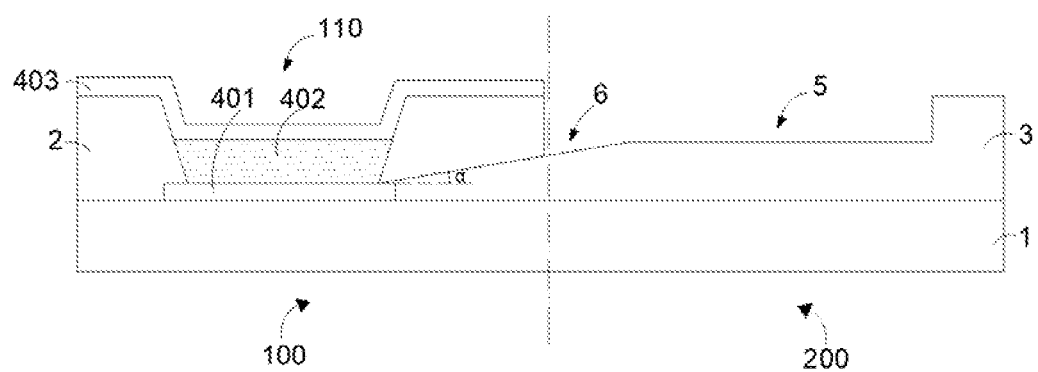
FIG. 2 is a structural cross-sectional view of FIG. 1 taken along A-A direction.

An embodiment provides a transparent display panel, which is suitable for being manufactured by the inkjet printing technology. The transparent display panel includes a plurality of pixel units. FIGS. 1 and 2 are schematic structural diagrams of a pixel unit according to an exemplary embodiment. FIG. 1 is a top view of the pixel unit in the exemplary embodiment, and FIG. 2 is a cross-sectional view of the pixel unit taken along A-A direction in the exemplary embodiment. The pixel unit includes a light-emitting area 100 and a transparent area 200. The pixel unit includes a substrate 1. A pixel defining layer 2 is disposed in the light-emitting area 100 of the substrate 1 and defines a plurality of opening areas 110. A light-emitting device 4 is disposed in the opening area 110. A transparent film layer 3 is disposed in the transparent area 200 of the substrate and is of a hydrophobic material. The transparent film layer 3 includes a groove 5 and a channel 6, and the channel 6 connects the groove 5 with any one of the opening areas 110. A distance from a bottom surface of the groove 5 to the substrate 1 is greater than a distance from a bottom surface of the opening area 110 to the substrate 1, that is, the bottom surface of the groove 5 is higher than the bottom surface of the opening area 110. The channel 6 has an inclined angle α relative to the substrate 1. A projection area of the groove 5 on the substrate 1 is greater than a projection area of the opening area 110 connected with the channel 6 on the substrate 1.

When manufacturing the transparent display panel of such structure, the ink of an organic light-emitting layer 402 to be printed may be printed in the groove 5 with a large area. Since the groove 5 and the channel 6 are formed on the hydrophobic material, the ink may flow into the opening area 110 with a smaller area through the inclined channel 6 under the action of the hydrophobic force, thereby forming the organic light-emitting layer 402 in the opening area 110. Therefore, even if the opening area 110 is small, it may be prepared by the inkjet printing technology, and meanwhile, the groove 5 and the channel 6 are formed in the transparent area 200 and thus will not affect the display of the light-emitting area 100. Especially for a high-precision transparent display panel with a small opening area 110, the inkjet printing may also be applied to the organic light-emitting layer 402, which overcomes the application limitation of inkjet printing technology.

It should be noted that the division of the light-emitting area and the transparent area in FIG. 1 is only an example. Based on such division method, since the channel 6 connects the groove 5 with the opening area 110, a part of the channel is located in the light-emitting area. However in the present disclosure, the channel 6 is regarded as being totally located in the transparent area.

For current OLED light-emitting materials, the light-emitting materials of the light-emitting devices 4 with different colors have different decay rates, among which a blue light material has the highest decay rate, a green light material has the decay rate higher than that of a red light material and lower than that of the blue light material, and the red light material has the lowest decay rate. In order to obtain a similar lifetime, when a pixel is designed, generally, a blue light sub-pixel is designed to be the largest, a green light sub-pixel is designed to have an area between the blue light sub-pixel and a red light sub-pixel, and the red light sub-pixel is designed to be the smallest. Therefore in an exemplary embodiment, the projections areas of the respective opening areas 110 in the pixel unit on the substrate 1 are not completely equal to each other, so the sub-pixel with the smallest area has higher requirements on the accuracy of the inkjet printing technology. In an exemplary embodiment, the channel 6 is connected with the opening area 110 having the smallest projection area, so that when the organic light-emitting layer 402 of the corresponding sub-pixel is subject to inkjet printing, the ink may be first printed into the groove 5 with a larger area, and then it flows into the opening area 110. In this way, the organic light-emitting layer 402 of the sub-pixel with the smallest opening area may be formed by using the inkjet printing technology.

The area of the groove 5 needs to be set according to the resolution and the printing accuracy of the inkjet printing apparatus. The area of the groove 5 should not be too large, otherwise it may occupy too much area of the transparent area 200, and the area of the groove 5 should not be too small, otherwise the inkjet printing apparatus is still difficult to accurately print ink thereinto and thus is difficult for preparing. On the other hand, the volume of the groove 5 needs to be set according to the volume of the to-be-printed material, so as to ensure that a sufficient volume of ink may be accommodated.

The inclined angle $\alpha$ of the channel 6 is between 5° and 50°. If the angle is less than 5°, it is difficult for the ink to flow smoothly to the opening area 110. If the angle is greater than 50°, in the case of the length of the channel remains unchanged, the thickness of the transparent film layer 3 needs to be larger, thereby increasing the thickness of the panel. Further, the channel with a larger angle requires higher process requirements during the fabrication thereof. When the inclined angle $\alpha$ of the channel is between 5° and 50°, the ink may flow smoothly from the groove 5 to the opening area 110, the panel may be kept relatively thin, and the fabrication thereof is convenient.

In an exemplary embodiment, the transparent film layer 3 and the pixel defining layer 2 may be formed of the same material and provided in the same layer to simplify the manufacturing process. Then, a material with both transparent and hydrophobic properties needs to be selected. In an embodiment, the material is a fluorine-modified transparent material, and may specifically be a fluorine-modified polyimide or a fluorine-modified polymethyl methacrylate. Polyimide and polymethyl methacrylate are water-absorbing materials, and fluorine atoms have high electronegativity. After modification by fluorine-containing monomers, the water absorption thereof may be reduced. The fluorine-containing monomers may be fluorine-containing organic solvents such as polypropylene pentafluorobenzene and hexafluorodianhydride, which are not particularly limited in the present disclosure. The higher the fluorine content, the lower the water absorption and the higher the hydrophobicity, the more apparent the repulsive effect on the ink, and the ink may be effectively pushed to the opening area. At the same time, the fluorine-modified polyimide or the fluorine-modified polymethyl methacrylate has a lower cost and is suitable for controlling the cost of the panel.

It should be noted that FIG. 2 only exemplarily shows some of the film layers of the light-emitting device, such as the cathode layer 403, anode layer 401 and organic light-emitting layer 402. Although other film layers are not shown in the figures, a person skilled in the art know that the light-emitting device may further include film layers such as a hole transport layer and an electron transport layer.

Several specific embodiments are given below to describe the structure of the transparent display panel of the present disclosure in detail.

Figure 3:
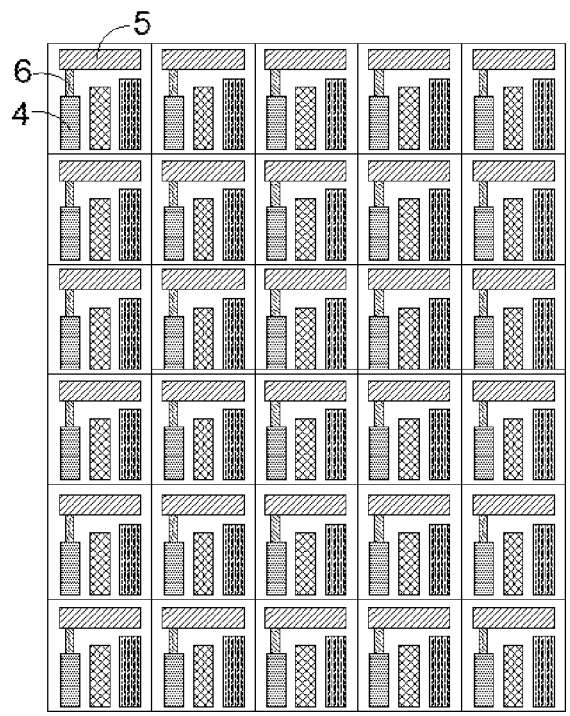
FIG. 3 is a schematic structural diagram of a display panel according to an embodiment.

As shown in FIGS. 1 to 3, a top view of a transparent display panel according to an exemplary embodiment is illustrated. The display panel includes a plurality of pixel units arranged in an array. The light-emitting area 100 and the transparent area 200 in the pixel unit of the display panel are arranged in a column direction, and the transparent area 200 is located at the upside of the light-emitting area 100. The light-emitting area 100 includes a red sub-pixel, a green sub-pixel, and a blue sub-pixel to form RGB three-color display, and the three sub-pixels are arranged along a row direction. That is, the light-emitting area 100 includes three opening areas 110, which are respectively used for arranging a red light-emitting device 41, a green light-emitting device 42 and a blue light-emitting device 43, and the three opening areas 110 are arranged along the row direction. Among the three opening areas, the opening area of the red sub-pixel 110 has the smallest area, the opening area 110 of the blue sub-pixel has the largest area, and the opening area 110 of the green sub-pixel has an area of middle size. In an exemplary embodiment, the groove 5 is disposed in the upper transparent area 200, and connects with the opening area 110 of the red sub-pixel through the channel 6. The area of the groove 5 is larger than the area of the opening area 110 of the red sub-pixel, and the groove 5 is higher than the opening area 110. During the inject printing, the red ink may be first printed in the groove 5, and then flow into the opening area 110 through the inclined channel 6 to form the red organic light-emitting layer 402.

In the structure shown in the figure, the red sub-pixel is located on the leftmost side of the pixel unit, so the channel 6 is also arranged at the upper side of the red sub-pixel. A person skilled in the art may understand that the sub-pixels of the three colors may also be arranged in other order, for example, the red sub-pixel is located in the middle or on the right side, as long as the groove 5 and the opening area 110 of the red sub-pixel can be connected by the channel 6.

In an exemplary embodiment, the groove 5 has a strip-shaped structure and extends in the row direction, so that the area of the transparent area 200 may be fully utilized. The extending direction of the channel 6 is perpendicular to the extending direction of the groove 5, and the ink may be injected into the opening area 110 through the shortest path, so as to prevent the ink from staying in the channel 6 or the groove 5.

Figure 4:
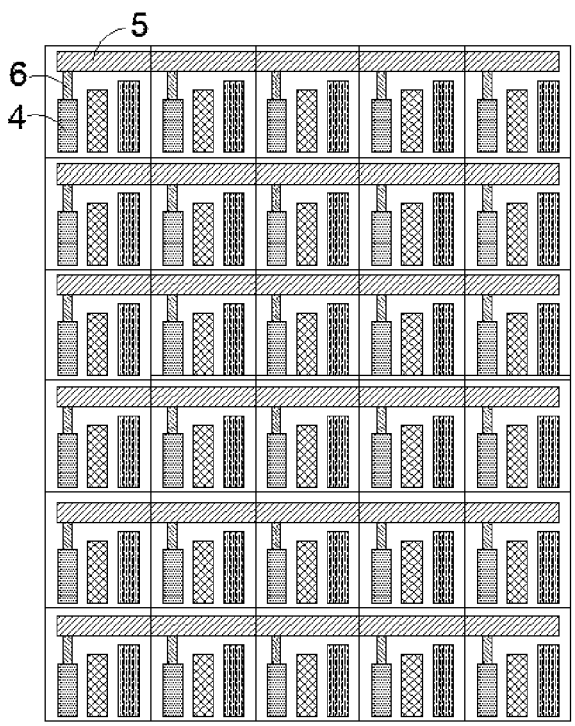
FIG. 4 is a schematic structural diagram of an optimized display panel according to an embodiment.

FIG. 4 shows a further simplified structure of the transparent display panel shown in FIG. 3. For the plurality of pixel units arranged in the row direction, the grooves 5 of each row of pixel units may be connected in the row direction, thereby the process difficulty may be reduced. Taking such pixel structure as an example, for a panel with a pixel density exceeding 160 or even 300 PPI, in a case of that the area of the groove 5 is larger than the area of the opening area 110 of the red sub-pixel, the width of the groove 5 does not exceed 80 μm, and the depth of the groove 5 does not exceed 1.5 μm, which may satisfy the accuracy requirements for printing the organic light-emitting layer 402 of the red sub-pixel by the existing inkjet printing apparatus.

Figure 5:
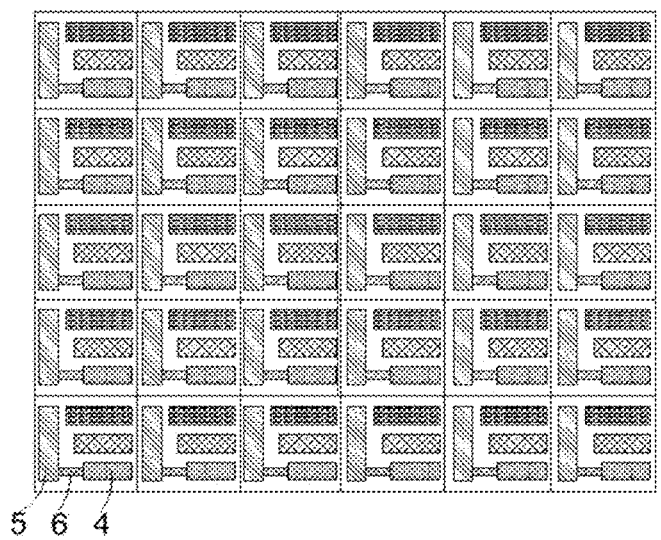
FIG. 5 is a schematic structural diagram of another arrangement form of a display panel according to an embodiment.

It should be noted that in the embodiments of FIGS. 3 and 4, the row direction is a first direction, and the column direction is a second direction. A person skilled in the art may understand that the column direction may be the first direction, and the row direction may be the second direction. Referring to FIG. 5, the transparent area 200 and the light-emitting area 100 are arranged in the row direction, and the pixels of the three colors of the light-emitting area 100 are arranged in the column direction, the extending direction of the grooves 5 is also the column direction, and the extending direction of the channel 6 is the row direction. Similarly, for a plurality of pixel units arranged along the column direction, the grooves 5 of each column of pixel units may also be connected in the column direction (not shown in the figure).

Figure 6:
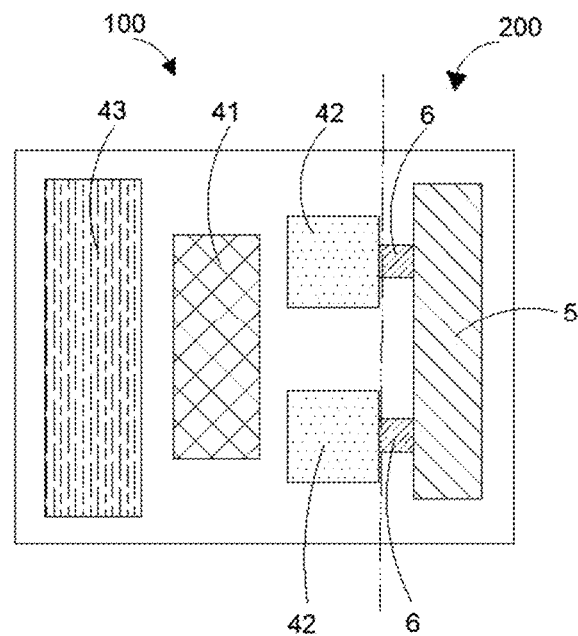
FIG. 6 is a schematic structural diagram of a pixel unit according to an embodiment.
Figure 7:
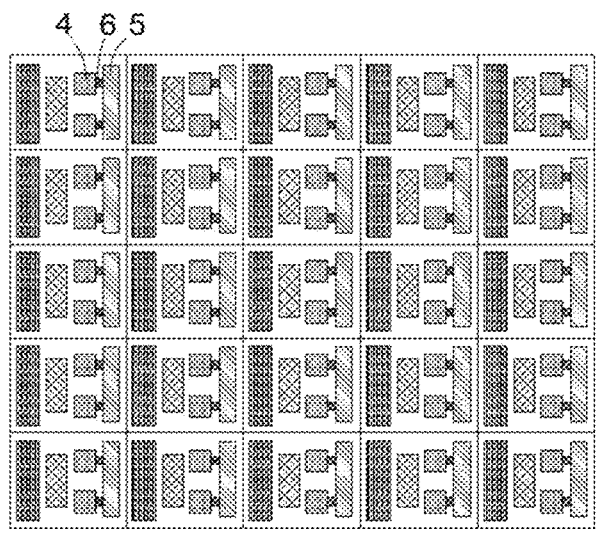
FIG. 7 is a schematic structural diagram of a display panel according to an embodiment.

FIG. 6 is a top view of a structure of a pixel unit according to an exemplary embodiment, and FIG. 7 is a top view of a transparent display panel according to the exemplary embodiment. Referring to FIGS. 6 and 7, the display panel includes a plurality of pixel units arranged in an array. The light-emitting area 100 and the transparent area 200 in the pixel unit are arranged in a row direction, and the transparent area 200 is located on the right side of the light-emitting area 100. The light-emitting area 100 includes a red sub-pixel, a blue sub-pixel and two green sub-pixels to form an RGGB three-color display. That is, the light-emitting area 100 includes four opening areas 110 for arranging a red light-emitting device 41, a blue light-emitting device 43 and two green light-emitting devices 42. In an embodiment, the two green sub-pixels are arranged along the column direction and are located on the right side of the light-emitting area 100, and the red and blue sub-pixels are arranged along the row direction and are located on the left side of the light-emitting area 100. The opening areas 110 of the two green sub-pixels have the same smallest area, the opening area 110 of the blue sub-pixel has the largest area, and the opening area 110 of the red sub-pixel has an area larger than that of the green sub-pixel and smaller than that of the blue sub-pixel. For a panel with such pixel structure, the green sub-pixel has the highest requirements for inkjet printing apparatus. In an exemplary embodiment, the groove 5 is provided in the transparent area 200 on the right side, and the transparent area 200 is further provided with two channels 6, and the two channels 6 respectively connect the opening areas 110 of the two green sub-pixels with the groove 5. The height of the bottom surface of the groove 5 is higher than the height of the bottom surface of the opening area 110 of the green sub-pixel, the area of the groove 5 is greater than the area of the opening area 110 of any green sub-pixel, and the volume of the groove 5 may accommodate two green sub-pixels at the same time. Therefore, the ink of the two green sub-pixels may be simultaneously printed in the groove 5 by one-step printing, and then the ink is divided into two paths through the two channels 6 and flows into the two opening areas 110 respectively. During inkjet printing, the green ink may be printed in the groove 5 first, and then flow into the opening area 110 through the inclined channel 6, so as to form the green organic light-emitting layer 402.

It should be noted that in an embodiment, the area of the groove 5 only needs to be larger than one of the opening areas 110 of the green sub-pixels to reduce the difficulty of inkjet printing, without making the area of the groove 5 larger than the sum of the areas of the opening areas 110 of the two green sub-pixels. Of course, if the area of the groove 5 is larger than the sum of the areas of the opening areas 110 of the two green sub-pixels, it is easier to realize inkjet printing. The volume of the groove 5 determines whether the two green sub-pixels may be printed at the same time. As long as the groove 5 may accommodate the organic light-emitting material of the two green sub-pixels, simultaneous printing may be achieved.

In another embodiment, the transparent area 200 may further include two grooves 5 (not shown in the figure), and the two channels 6 connect the two grooves 5 and the two green sub-pixels in a one-to-one correspondence. The area of each groove 5 is larger than the area of the opening area 110 of the corresponding green sub-pixel. During printing, the green ink in each groove 5 flows into the corresponding opening area 110 to complete the film layer preparation in the opening area 110. This structure may also reduce the difficulty of inkjet printing. However, understandably, this structure has relatively high requirements on the manufacturing process of the panel.

Similar to the previous embodiment, in an embodiment, the groove 5 also has a strip-shaped structure and extends along the column direction, and the extending directions of the two channels 6 are perpendicular to the extending direction of the groove 5, i.e., the two channels 6 extend along the row direction, so that the ink may be injected into the opening area 110 through the shortest path, and the ink is prevented from staying in the channel 6 or the groove 5.

Figure 8:
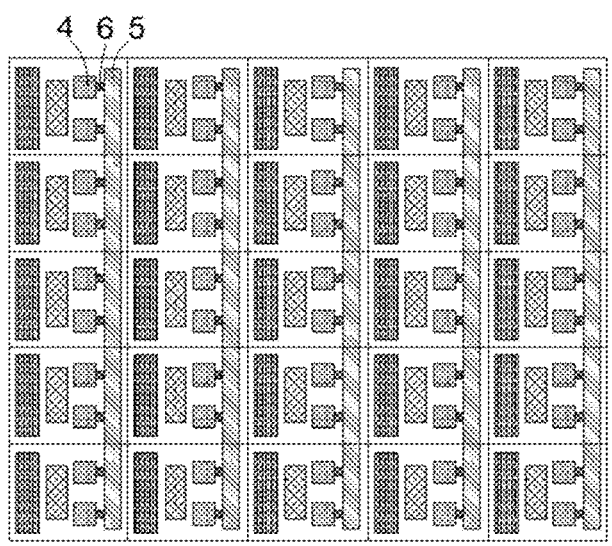
FIG. 8 is a schematic structural diagram of an optimized display panel according to an embodiment.

FIG. 8 shows a further simplified structure of the transparent display panel shown in FIG. 7. For a plurality of pixel units arranged in the column direction, the grooves 5 of each column of pixel units may be connected in the column direction, thereby reducing the process difficulty.

In the pixel structures shown in FIGS. 7-8, the two green sub-pixels are located on the rightmost side of the light-emitting area 100, so the channel 6 is also arranged on the right side of the two green sub-pixels. A person skilled in the art may understand that the four sub-pixels may also be arranged in other order, for example, the red sub-pixel is located on the left, the blue sub-pixel is located in the middle, and the two green sub-pixels are located on the right, as long as the channel 6 is sufficient to connect the groove 5 with the opening areas 110 of the two sub-pixels.

Figure 9:
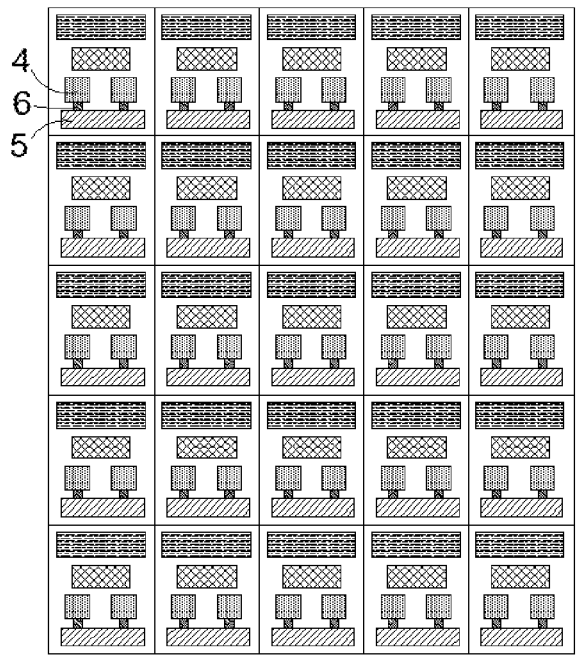
FIG. 9 is a schematic structural diagram of another arrangement form of a display panel according to an embodiment.

It should be noted that in an exemplary embodiment, the column direction is the first direction, and the row direction is the second direction. A person skilled in the art may understand that the row direction may also be the first direction, and the column direction may be the second direction. Referring to FIG. 9, the transparent area 200 and the light-emitting area 100 are arranged along the column direction, the red and blue sub-pixels in the light-emitting area 100 are arranged in the column direction, the two green sub-pixels are arranged in the row direction, the extending direction of the groove 5 is also the row direction, and the extending direction of the channel 6 is the column direction. Similarly, for a plurality of pixel units arranged in the row direction, the grooves 5 of each row of pixel units may also be connected in the row direction (not shown in the figure).

Figure 10:
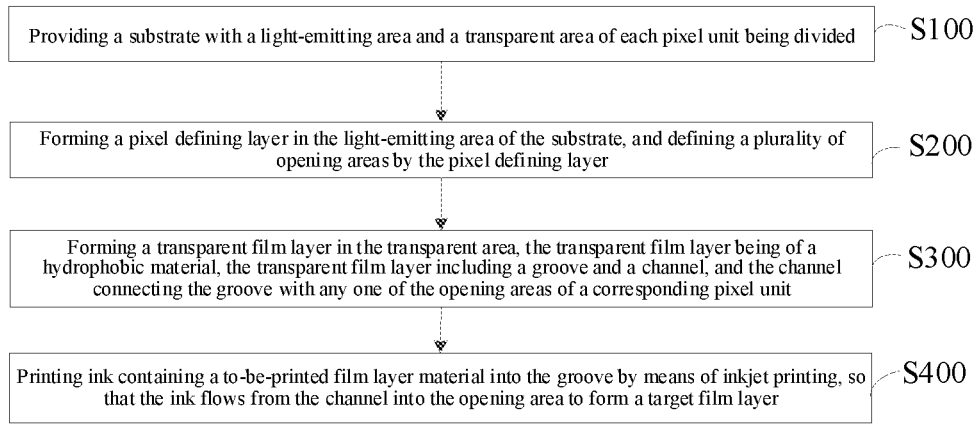
FIG. 10 is a flow chart of a manufacturing process of a display panel according to an embodiment.

An embodiment also provides a method for manufacturing a transparent display panel. Taking the display panel as shown in FIG. 2 as an example, referring to FIG. 10, the manufacturing method includes:

step S100, providing a substrate 1 with a light-emitting area 100 and a transparent area 200 of each pixel unit being divided;

step S200, forming a pixel defining layer 2 in the light-emitting area 100 of the substrate 1, and defining a plurality of opening areas 110 by the pixel defining layer 2;

step S300, forming a transparent film layer 3 in the transparent area, 200 the transparent film layer 3 being of a hydrophobic material, the transparent film layer 3 including a groove 5 and a channel 6, and the channel 6 connecting the groove 5 with any one of the opening areas 110 of a corresponding pixel unit, wherein the channel 6 has an inclined angle relative to the substrate 1, a distance from a bottom surface of the groove 5 to the substrate 1 is greater than a distance from a bottom surface of the opening area 110 to the substrate 1, and a projection area of the groove 5 on the substrate 1 is greater than a projection area of the opening area 110 connected with the channel 6 on the substrate 1;

step S400, printing ink containing a to-be-printed film layer material into the groove 5 by means of inkjet printing, so that the ink flows from the channel 6 into the opening area 110 to form a target film layer.

In the above method, in step S100, a thin film transistor array may be pre-formed on the substrate 1, so as to realize independent control of the sub-pixels. Before forming the pixel defining layer 2 of the light-emitting area 100 in step S200, the opening area 110 of the light emitting device 4 is usually formed first, and the opening area 110 may be formed by a process such as sputtering. The pixel defining layer 2 may be formed by exposing and developing a transparent photoresist material.

When the pixel defining layer 2 in the above step S200 and the transparent film layer 3 in the step S300 are made of the same material, such as fluorine-modified polyimide or fluorine-modified polymethyl methacrylate, the two film layers may be formed through the same process. Specifically, a layer of fluorine-modified polyimide or fluorine-modified polymethyl methacrylate is firstly coated or deposited on the light-emitting area 100 and the transparent area 200. Both of the two materials may form a transparent photoresist film. Then, the transparent photoresist film is exposed using a photomask, the exposed transparent photoresist film is developed, and the unexposed transparent photoresist film is removed to form the pixel defining layer 2 and the transparent film layer 3.

It should be noted that when the channel 6 in the transparent film layer 3 is formed, since the channel 6 has an inclined angle, it needs to be formed by a grayscale exposure process, that is, a photomask used for forming the channel 6 is a grayscale mask, so that an inclined bottom surface of the channel 6 may be formed after development by different exposure amounts. Subsequent steps are continuously performed on the display panel in which the groove 5 and the channel 6 are formed in the transparent area 200, and a better printing effect may be achieved.

In step S400, by taking the inkjet printing of the organic light-emitting layer 402 as an example, before printing the organic light-emitting layer 402, it is necessary to form film layers such as a hole injection layer, a hole transport layer, and an electron blocking layer in the opening area 110. These film layers may be formed by evaporation, chemical deposition, or the like. Then, when the organic light-emitting layer 402 of the red sub-pixel is formed, the red ink may be printed in the groove 5 of the transparent area 200 by means of inkjet printing. Since the area of the groove 5 is relatively large, the inkjet printing is easier to be achieved. Then, the ink flows into the opening area 110 of the red sub-pixel through the channel 6 under the action of the hydrophobic material, thereby forming the red organic light-emitting layer 402. When forming the organic light-emitting layers 402 of the sub-pixels of other colors, since the area of the opening area 110 is relatively large, the ink may be directly printed in the opening area 110 by a conventional inkjet printing method.

This step may be used not only to print the organic light-emitting layer 402 of the red sub-pixel, but also to print the organic light-emitting layers 402 of other color sub-pixels, as long as a corresponding structure of the groove 5 and channel 6 are formed when the transparent film layer 3 is formed in step S300. Of course, this step may also be used to realize inkjet printing of other target film layers such as a hole transport layer. The printing principle is the same as that of the organic light-emitting layer 402, and details thereof are not repeated here.

In addition to the above steps, the manufacturing of the display panel also includes forming film layers such as an electron transport layer, an electron injection layer, and a cathode layer.

An embodiment also provides a display device, which includes the transparent display panel according to the above-mentioned embodiment. Since the display device has the above-mentioned transparent display panel, it has the same beneficial effects, which will not be repeated in the present disclosure.

The present disclosure does not specifically limit the application of the display device, which may be any product or component with a display function, such as a TV, a notebook computer, a tablet computer, a wearable display device, a mobile phone, a car display, a navigation, an e-book, a digital photo frame, an advertising light box, etc.

Although relative terms such as "upper" and "lower" are used in the specification to describe the relative relationship of one component to another component shown, these terms are used in the specification only for convenience of description according to the example direction shown in the figures. It will be appreciated that if a device shown is turned upside down, the component described as "upper" will become the component as "lower". When a certain structure is "on" another structure, it may mean that the structure is integrally formed on said another structure, or that the structure is arranged "directly on" said another structure, or that the certain structure is arranged "indirectly on" said another structure through an additional structure.

The terms "a", "an", "the", "said" and "at least one" are used to indicate the presence of one or more elements/components/etc.; the terms "include" and "have" are used to indicate an open-ended inclusive means and means that additional elements/components/etc. may be present in addition to the listed elements/components/etc.

A person skilled in the art may easily conceive of other embodiments of the present disclosure upon consideration of the specification and practice of the invention disclosed herein. The present disclosure is intended to cover any variations, uses, or adaptations of the present disclosure that follow the general principle of the present disclosure and include common general knowledge or techniques in the technical field not disclosed by the present disclosure. The specification and examples are to be regarded as exemplary only, with the true scope and spirit of the present disclosure being indicated by the appended claims.

What is claimed is:

1. A transparent display panel, comprising:
a plurality of pixel units arranged in an array, the pixel unit comprising a light-emitting area and a transparent area, wherein the pixel unit comprises:
a substrate;
a pixel defining layer disposed in the light-emitting area of the substrate, and defining a plurality of opening areas;
a plurality of light-emitting devices disposed in the plurality of opening areas in a one-to-one correspondence; and
a transparent film layer disposed in the transparent area of the substrate and being of a hydrophobic material, the transparent film layer comprising a groove and a channel, and the channel connecting the groove with any one of the opening areas,
wherein the channel has an inclined angle relative to the substrate, a distance from a bottom surface of the groove to the substrate is greater than a distance from a bottom surface of the opening area to the substrate, and a projection area of the groove on the substrate is greater than a projection area of the opening area connected with the channel on the substrate,
wherein the transparent film layer and the pixel defining layer are formed of a same material and provided in a same layer.

2. The transparent display panel according to claim 1, wherein projection areas of respective opening areas in the pixel unit on the substrate are not exactly the same, and the channel connects the groove with the opening area having a smallest projection area.

3. The transparent display panel according to claim 2, wherein the pixel unit comprises a red light-emitting device, the red light-emitting device is disposed in the opening area having the smallest projection area, and the channel connects the groove with the opening area provided with the red light-emitting device.

4. The transparent display panel according to claim 3, wherein in the pixel unit, the respective opening areas are arranged along a first direction, the transparent area and the light-emitting area are arranged along a second direction perpendicular to the first direction, and the groove is strip-shaped and extends along the first direction.

5. The transparent display panel according to claim 2, wherein the pixel unit comprises two green light-emitting devices, the two green light-emitting devices are disposed in two opening areas having the smallest projection area, the pixel unit comprise two channels, and the two channels connects the groove with the two opening areas provided with the two green light-emitting devices in a one-to-one correspondence.

6. The transparent display panel according to claim 5, wherein in the pixel unit, the opening areas provided with the two green light-emitting devices are arranged along a first direction, the transparent area and the light-emitting area are arranged along a second direction perpendicular to the first direction, and the groove is strip-shaped and extends along the first direction.

7. The transparent display panel according to claim 1, wherein the grooves of respective pixel units arranged in a same straight line are connected with each other.

8. The transparent display panel according to claim 7, wherein an extending direction of the groove is perpendicular to an extending direction of the channel.

9. The transparent display panel according to claim 1, wherein the inclined angle of the channel is 5° to 50°.

10. The transparent display panel according to claim 1, wherein the hydrophobic material comprises fluorine-modified polyimide or fluorine-modified polymethyl methacrylate.

11. A display device, comprising:
a transparent display panel, wherein the transparent display panel comprises a plurality of pixel units arranged in an array, and the pixel unit comprises a light-emitting area and a transparent area, wherein the pixel unit comprises:
a substrate;
a pixel defining layer disposed in the light-emitting area of the substrate and defining a plurality of opening areas;
a plurality of light-emitting devices disposed in the plurality of opening areas in a one-to-one correspondence; and
a transparent film layer disposed in the transparent area of the substrate and being of a hydrophobic material, the transparent film layer comprising a groove and a channel, and the channel connecting the groove with any one of the opening areas,
wherein the channel has an inclined angle relative to the substrate, a distance from a bottom surface of the groove to the substrate is greater than a distance from a bottom surface of the opening area to the substrate, and a projection area of the groove on the substrate is greater than a projection area of the opening area connected with the channel on the substrate,
wherein the transparent film layer and the pixel defining layer are formed of a same material and provided in a same layer.

12. A method for manufacturing a transparent display panel, comprising:
providing a substrate with a light-emitting area and a transparent area of each pixel unit being divided;
forming a pixel defining layer in the light-emitting area of the substrate, and defining a plurality of opening areas by the pixel defining layer;
forming a transparent film layer in the transparent area, the transparent film layer being of a hydrophobic material, the transparent film layer comprising a groove and a channel, and the channel connecting the groove with any one of the opening areas of a corresponding pixel unit, wherein the channel has an inclined angle relative to the substrate, a distance from a bottom surface of the groove to the substrate is greater than a distance from a bottom surface of the opening area to the substrate, and a projection area of the groove on the substrate is greater than a projection area of the opening area connected with the channel on the substrate;
printing ink containing a to-be-printed film layer material into the groove by means of inkjet printing, so that the ink flows from the channel into the opening area to form a target film layer.

13. The method according to claim 12, wherein the target film layer is an organic light-emitting layer.

14. The display device according to claim 11, wherein projection areas of respective opening areas in the pixel unit on the substrate are not exactly the same, and the channel connects the groove with the opening area having a smallest projection area.

15. The display device according to claim 14, wherein the pixel unit comprises a red light-emitting device, the red light-emitting device is disposed in the opening area having the smallest projection area, and the channel connects the groove with the opening area provided with the red light-emitting device.

16. The display device according to claim 15, wherein in the pixel unit, the respective opening areas are arranged along a first direction, the transparent area and the light-emitting area are arranged along a second direction perpendicular to the first direction, and the groove is strip-shaped and extends along the first direction.

17. The display device according to claim 14, wherein the pixel unit comprises two green light-emitting devices, the two green light-emitting devices are disposed in two opening areas having the smallest projection area, the pixel unit comprise two channels, and the two channels connects the groove with the two opening areas provided with the two green light-emitting devices in a one-to-one correspondence.

18. The display device according to claim 17, wherein in the pixel unit, the opening areas provided with the two green light-emitting devices are arranged along a first direction, the transparent area and the light-emitting area are arranged along a second direction perpendicular to the first direction, and the groove is strip-shaped and extends along the first direction.

19. The display device according to claim 11, wherein the grooves of respective pixel units arranged in a same straight line are connected with each other.

\* \* \* \* \*